CIRCUIT FOR SWITCHING HIGH VOLTAGE USING CASCADE
CONNECTED LOW VOLTAGE TRANSISTORS

Filed Feb. 21, 1957

INVENTORS
ROGER P. SOURGENS
RAYMOND A. CHOLLET

BY Otto John Munz
ATTORNEY

United States Patent Office 2,835,829

Patented May 20, 1958

2,835,829

CIRCUIT FOR SWITCHING HIGH VOLTAGE USING CASCADE CONNECTED LOW VOLTAGE TRANSISTORS

Roger P. Sourgens, Bellevue, and Raymond A. Chollet, Boissy-Saint-Leger, France

Application February 21, 1957, Serial No. 641,701

Claims priority, application France February 29, 1956

2 Claims. (Cl. 307—88.5)

The present invention relates to electronic switching devices which use transistors and enable an electric circuit to be opened or closed, such as are used in telecontrol systems, accounting machines and, in general, whenever it is necessary to pass from electronics to mechanics through the intermediary of electro-mechanics.

Such devices already exist, but they can supply only small power. As a matter of fact, the usual electronic valves admit only low intensity currents, whereas transistors, if they can supply relatively high intensities, have their employment limited by the relatively low maximum voltage which it is possible to apply to them.

The subject matter of the present invention is a transistor amplifying device which is capable of delivering considerable intensities under high voltages to switching members such as relays, while preserving the advantages which belong to transistor electronic switching, namely absence of bad contact, absence of rebound of relay armatures, negligible time of response, silent operation, possibility of use as soon as voltage is applied, practically no upkeep work, etc.

According to the present invention, the transistor electronic switching device consists of a certain number of cascade-connected transistors which are connected together in such a manner that at no instant is any one of these transistors subjected to a voltage which is greater than a value that is predetermined as a function of the characteristics of the transistors used. The maximum voltage available for the switching device is the sum of the maximum voltages applicable to the respective transistors of the system, whilst the maximum intensity available for the switching device is the same as that of a transistor that is used separately.

The cascade connection of the transistors is such that the blocking of a particular transistor causes the blocking of the next transistor and, consequently, the blocking of all the succeeding transistors.

This result is obtained, on the one hand, by a direct connection of the collector of a transistor to the emitter of the next transistor and, on the other hand, by a network of suitable resistances which fixes the common potential of these two electrodes in relation to that of the base of the next transistor.

Figure 1:
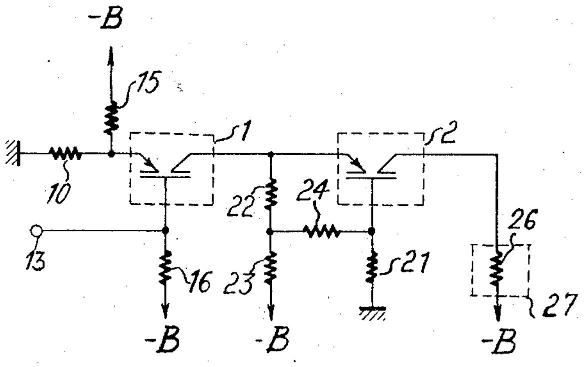
Figure 2:
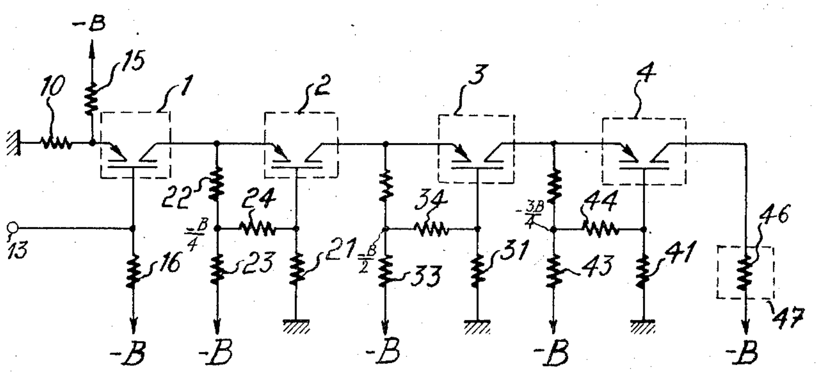

In any case, the invention will be better understood with the aid of two examples of connection diagrams according to the invention which will be described with reference to the accompanying drawings, of which Fig. 1 is the diagram of a switching device having two transistors; and Fig. 2 is the diagram of a switching device having four transistors.

The switching device shown in Fig. 1 comprises two transistors denoted by 1 and 2. The collector of the transistor 1 is connected directly to the emitter of the transistor 2 and their common potential is fixed by a network of resistances 22, 23 and 21, the last mentioned of which being the resistance of the base circuit of the transistor 2 and being connected to earth, and by the state of conduction of the transistors. The base of the transistor 1 is connected to a source of negative voltage —B through the intermediary of the resistance 16. This source of voltage has a greater electromotive force than the maximum voltage that the transistors can sustain between the emitter and the collector. Numerical values will be given hereinafter. The emitter of the transistor 1 is brought to a potential which is slightly negative in relation to earth owing to a divider constituted by resistances 10 (of low value) and 15 (of high value). This voltage-divider is connected between earth and the source of negative voltage —B. Finally, the collector of the transistor 2 is connected to the same negative source through the impedance 26 of a utilising member 27 which may be an electromagnetic relay.

If the terminal 13, which is connected to the base of the transistor 1, is brought to zero potential, the transistor 1 is blocked, and the potential of its collector is fixed by the voltage-divider constituted by the resistances 23 and 21. If, for example, these two resistances have the same value, the potential of the collector of the transistor 1 is about $$-\frac{B}{2}$$

The voltage sustained by the transistor 1 between the emitter and the collector is therefore $$\frac{B}{2} \text{ volts}$$

In the same way, the potential of the emitter of the transistor 2 is $$-\frac{B}{2}$$

The potential of the base and the emitter of the transistor is $$-\frac{B}{2}$$

As the base and the emitter of the transistor 2 are at the same potential, the latter transistor is blocked. For this reason, the intensity in the collector is almost zero and the potential of the latter is very nearly —B. As the transistor 2 has its collector at the potential —B and its emitter at the potential $$-\frac{B}{2}$$

it is subjected to a voltage $$\frac{B}{2}$$

If the terminal 13 is brought to a negative potential, an emitter current is produced in the transistor 1 and gives rise to saturation. For this reason, the transistor 1 is unblocked and its collector passes from the potential $$-\frac{B}{2}$$

to a negative potential which is very nearly zero. This great rise in potential is applied to the emitter of the transistor 2. For this reason, an emitter current is produced therein which gives rise to the saturation and, consequently, to the unblocking of the transistor 2. As the two transistors are then unblocked, the load resistance 26 is traversed by a current, the intensity of which depends upon the value of the resistance, the admissible maximum intensity being fixed by the characteristics of the transistors used.

As an improvement and modification, it is advantageous, in certain cases, to complete the network of the resistances 21, 22 and 23 by a low-value resistance 24 shown in dotted line. The blocking of the transistor 2, which is consecutive to the blocking of the transistor 1, is more powerful; in fact, the base is rendered more positive in relation to the emitter.

With the present-day transistors which admit a maximum voltage of 30 volts, a suitable value for the voltage —B of the source is —50 volts. During the period of the blocking, each transistor is sustaining a voltage of 25 volts. If the transistors 1 and 2 are sustaining an intensity of 2 amperes, the switching device is capable of switching on and off a utilisation circuit that consumes 100 watts, whilst trigger pulses are applied to the input terminal 13.

Fig. 2 is a diagram of a switching device having four transistors 1, 2, 3 and 4. The part of the diagram which concerns the transistors is similar to the diagram shown in Fig. 1, except for two differences, namely, on the one hand, the resistances 23 and 21 are no longer substantially equal but are in the ratio of 3 to 1. On the other hand, the load resistance 26 of the transistor 2 (Fig. 1) has been replaced, in Fig. 2, by the continuation of cascade-connected transistors 3 and 4.

These two transistors 3 and 4 have their emitting and base electrodes connected in the same way as for the transistor 2. However, the resistances 33 and 34 are equal and the resistances 43 and 41 are in the ratio of 1 to 3, all these ratios being approximate and not critical for a correct operation of the switching device.

The utilisation circuit, represented at 47, is placed in the circuit of the collector electrode of the transistor 4. Its internal resistance is represented at 46.

In the switching device, each transistor blocks or unblocks the transistor which immediately follows it according to whether it is itself blocked or unblocked.

If the terminal 13 is brought to zero potential, all the transistors are blocked, and a substantially zero current passes through the utilization circuit 47. The potentials of the collectors of the transistors, in the order 1, 2, 3, 4, are substantially $$-\frac{B}{4},\ -\frac{B}{2},\ -\frac{3}{4}B,\ -B$$

If the terminal 13 is brought to a negative potential, the transistors are unblocked and are traversed substantially by a large current, the valve of which depends principally upon the resistance 46 of the utilisation circuit 47.

With the usual types of transistors, which admit a maximum voltage of 30 volts and a maximum intensity of 2 amperes, a value of —100 volts can be given to —B and a utilisation circuit which consumes 200 watts can be switched on and off.

When blocked, each transistor is subjected to a voltage of 25 volts. When unblocked, it is traversed by 2 amperes.

More generally, if B is the voltage which is to be switched on and off and $e$ is the maximum voltage which can be applied to the type of transistor employed, the number N of transistors that are necessary should respond to the condition $$N>\frac{B}{e}$$

and the ratio of the resistances such as 23 and 21 for the transistor of the order $p$ should be $$\frac{N-p+1}{p-1}$$

which corresponds to a bias voltage of $$\frac{pB}{N}$$

of the emitter and of the base of the transistor of the order $p$.

Under these conditions, the voltage to be switched on and off is distributed uniformly among the various transistors constituting the switching device.

It has always hitherto been understood that the transistors used in a given switching device had the same characteristics. Although this arrangement is logical, it does not constitute a necessity and it is possible to produce a switching device according to the invention with transistors having different characteristics. In this case, the maximum intensity admitted for the switching device is the lowest of the intensities sustained by the transistors of the switching device, and the maximum voltage is the sum of the voltages which can be applied individually to the transistors. It is advisable to distribute this voltage as a function of the characteristics of the transistors and to give the bias voltages values in relation to this distribution, which, finally, means values which are fixed for the ratios of the resistances such as 23 and 21.

What we claim is:

1. A transistor switching device adapted to switch on and off, through a load, a current produced by a source having a voltage greater than that which may be applied between the emitter and the collector of the transistors of said device, comprising a plurality of N cascade-connected transistors, the emitter of a transistor being directly coupled to the collector of the preceding one, the first of said transistors being triggered by pulses applied between its emitter and base, the last of said transistors having the load inserted betwen its collector and said source, the collector of the $(p-1)^{th}$ transistor and the emitter of the $p^{th}$ transistor, which are directly coupled, being connected to a pole of the source through a first resistance and a second resistance in series and to the other pole of the source through a third resistance in parallel with the second one and which is also connected to the base of the $p^{th}$ transistor, the ratio of the values of the second and third resistances being equal to $$\frac{N-p+1}{p-1}$$

for the transistor of the order $p$.

2. A transistor switching device adapted to switch on and off, through a load, a current produced by a source having a voltage greater than that which may be applied between the emitter and the collector of the transistors of said device, comprising a plurality of N cascade-connected transistors, the emitter of a transistor being directly coupled to the collector of the preceding one, the first of said transistors being triggered by pulses applied between its emitter and base, the last of said transistors having the load inserted betwen its collector and said source, the collector of the $(p-1)^{th}$ transistor and the emitter of the $p^{th}$ transistor, which are directly coupled, being connected to a pole of the source through a first resistance and a second resistance in series and to the other pole of the source through a fourth and a third resistances in parallel with the second one, said third resistance being also connected to the base of the $p^{th}$ transistor, the ratio of the values of the second resistance on the one hand and of the sum of the third and fourth resistances on the other hand being equal to $$\frac{N-p+1}{p-1}$$

for the transistor of the order $p$.

No references cited.